United States Patent
Sun et al.

(10) Patent No.: US 10,134,764 B2
(45) Date of Patent: Nov. 20, 2018

(54) FLEXIBLE SUBSTRATE AND MANUFACTURING METHOD THEREOF, FLEXIBLE DISPLAY PANEL AND FLEXIBLE DISPLAY DEVICE

(71) Applicant: BOE TECHNOLOGY GROUP CO., LTD., Beijing (CN)

(72) Inventors: Hongda Sun, Beijing (CN); Li Sun, Beijing (CN); Dongfang Wang, Beijing (CN); Xiangyong Kong, Beijing (CN)

(73) Assignee: BOE Technology Group Co., Ltd, Beijing (CN)

( * ) Notice: Subject to any disclaimer, the term of this patent is extended or adjusted under 35 U.S.C. 154(b) by 0 days.

(21) Appl. No.: 15/322,405

(22) PCT Filed: Mar. 16, 2016

(86) PCT No.: PCT/CN2016/076507
§ 371 (c)(1),
(2) Date: Dec. 27, 2016

(87) PCT Pub. No.: WO2016/161878
PCT Pub. Date: Oct. 13, 2016

(65) Prior Publication Data
US 2017/0133407 A1    May 11, 2017

(30) Foreign Application Priority Data
Apr. 7, 2015    (CN) .......................... 2015 1 0162271

(51) Int. Cl.
*H01L 27/12*    (2006.01)
*H01L 29/786*    (2006.01)

(52) U.S. Cl.
CPC ...... *H01L 27/1218* (2013.01); *H01L 27/1244* (2013.01); *H01L 27/1262* (2013.01); *H01L 29/78603* (2013.01); *H01L 29/78618* (2013.01)

(58) Field of Classification Search
CPC ................ H01L 27/12; H01L 27/1218; H01L 29/78603; H01L 27/1244; H01L 27/1248;
(Continued)

(56) References Cited

U.S. PATENT DOCUMENTS

2012/0154707 A1* 6/2012 Hsieh ................. H01L 51/0097
                                                              349/60
2013/0002133 A1   1/2013 Jin et al.
(Continued)

FOREIGN PATENT DOCUMENTS

| CN | 103389822 A | 11/2013 |
| CN | 104299832 A | 1/2015  |

(Continued)

OTHER PUBLICATIONS

Written Opinion of the International Searching Authority from corresponding PCT Application No. PCT/CN2016/076507, dated Jun. 22, 2016 (4 pages).
(Continued)

*Primary Examiner* — Chuong A Luu
(74) *Attorney, Agent, or Firm* — Harness, Dickey & Pierce, P.L.C.

(57) ABSTRACT

The invention provide a flexible substrate and manufacturing method thereof, flexible display panel and flexible display device, wherein the flexible substrate comprises a first film layer and a second film layer, and further comprises a first flexible layer and a second flexible layer; the first film layer and the second film layer are located between the first flexible layer and the second flexible layer; the first film
(Continued)

layer and the first flexible layer are bonded with each other, and the second film layer and the second flexible layer are bonded with each other; when the flexible substrate bends towards a first side, the first film layer and the second film layer can contact each other and form electric connection as the first flexible layer and the second flexible layer bend; and when the flexible substrate bends towards a second side or does not bend, the first film layer and the second film layer can be separated from each other and disconnect the electric connection as the first flexible layer and the second flexible layer bend or do not bend. The present invention solves the problem that bending a flexible display panel may damage the internal components thereof.

20 Claims, 6 Drawing Sheets

(58) Field of Classification Search
CPC ............... H01L 27/1262; H01L 29/786; H01L 29/78618; H01L 29/78642
USPC .......................................................... 257/66
See application file for complete search history.

(56) References Cited

U.S. PATENT DOCUMENTS

| | | | |
|---|---|---|---|
| 2013/0300677 A1* | 11/2013 | Kim | G06F 3/0414 345/173 |
| 2014/0217397 A1* | 8/2014 | Kwak | H01L 27/1218 257/43 |
| 2016/0254328 A1 | 9/2016 | Song | |

FOREIGN PATENT DOCUMENTS

| | | |
|---|---|---|
| CN | 104318861 A | 1/2015 |
| CN | 104716148 A | 6/2015 |

OTHER PUBLICATIONS

Office Action from corresponding Chinese Application No. 201510162271.1, dated Mar. 28, 2017 (6 pages).

* cited by examiner

FLEXIBLE SUBSTRATE AND MANUFACTURING METHOD THEREOF, FLEXIBLE DISPLAY PANEL AND FLEXIBLE DISPLAY DEVICE

TECHNICAL FIELD

Embodiments of the present invention relate to the technical field of flexible displays, in particular to a flexible substrate and manufacturing method thereof, flexible display panel and flexible display device.

BACKGROUND

When utilizing the flexible display technology to realize curved surface display, there is a possibility that intra-pixel components are damaged during bending. For example, film layers with poor extensibility such as a gate insulating layer, a passivation layer and the like in a flexible substrate, and film layers prone to be damaged such as an active layer, an ITO (indium tin oxide) layer and the like, are all possibly subject to excessive stretching force during bending, thus damaging the pixels, resulting in quality problems such as dead pixels and dead pixel lines on the display panel.

SUMMARY OF THE INVENTION

In view of the defects in the prior art, the present invention provides a flexible substrate and manufacturing method thereof, flexible display panel and flexible display device, and solves the problem that bending a flexible display panel may damage the internal components thereof.

In a first aspect, the present invention provides a flexible substrate, the flexible substrate comprising a first film layer and a second film layer;

the flexible substrate further comprises a first flexible layer and a second flexible layer; the first film layer and the second film layer being located between the first flexible layer and the second flexible layer;

the first film layer and the first flexible layer are bonded with each other, and the second film layer and the second flexible layer are bonded with each other;

when the flexible substrate bends towards a first side, the first film layer and the second film layer can contact each other and form electric connection as the first flexible layer and the second flexible layer bend; and when the flexible substrate bends towards a second side or does not bend, the first film layer and the second film layer can be separated from each other and disconnect the electric connection as the first flexible layer and the second flexible layer bend or do not bend.

Optionally, the surface of the first film layer adjacent to the second film layer is a first preset surface having a preset shape;

the surface of the second film layer adjacent to the first film layer is a second preset surface complementary to the first preset surface in shape.

Optionally, the first preset surface and the second preset surface are both inclined surfaces having preset inclination angles.

Optionally, the binding force between the first film layer and the first flexible layer is greater than the binding force between the first film layer and the second flexible layer; and the binding force between the second film layer and the second flexible layer is greater than the binding force between the second film layer and the first flexible layer.

Optionally, the flexible substrate further comprises a transistor, and a pixel electrode which is electrically connected to the source electrode or drain electrode of the transistor in an operating state;

the first film layer is the source electrode or drain electrode of the transistor; and the second film layer is the pixel electrode.

Optionally, the flexible substrate further comprises a transistor; the transistor comprises a source electrode, a drain electrode and an active layer; in an operating state, the source electrode and the drain electrode are electrically connected to the active layer respectively;

the first film layer is the source electrode or drain electrode of the transistor; and the second film layer is the active layer.

Optionally, the first flexible layer is provided therein with at least one first via; and the second flexible layer is provided therein with at least one second via.

Optionally, the flexible substrate comprises a base substrate; the base substrate comprises a plurality of first areas formed by a flexible material and a plurality of second areas formed by a rigid material; the plurality of first areas and the plurality of second areas are arranged alternately.

Optionally, the flexible substrate further comprises a first spacer layer and/or a second spacer layer between the first flexible layer and the second flexible layer;

the first spacer layer is disposed on the first flexible layer, and the surface thereof facing the second flexible substrate is a smooth surface; and the second spacer layer is disposed on the second flexible layer, and the surface thereof facing the first flexible substrate is a smooth surface.

Optionally, the flexible substrate further comprises a first buffer layer and/or a second buffer layer between the first flexible layer and the second flexible layer;

the first buffer layer is disposed on the first flexible layer in at least some areas corresponding to the second film layer, and the surface thereof facing the second film layer is a smooth surface; and the second buffer layer is disposed on the second flexible layer in at least some areas corresponding to the first film layer, and the surface thereof facing the first film layer is a smooth surface.

In a second aspect, the present invention further provides a manufacturing method of a flexible substrate, comprising:

forming a first flexible layer on a first substrate, and forming a pattern comprising a first film layer on the first flexible layer;

forming a second flexible layer on a second substrate, and forming a pattern comprising a second film layer on the second flexible layer;

laminating the first substrate and the second substrate face to face, such that:

the first film layer and the second film layer are located between the first flexible layer and the second flexible layer;

when the flexible substrate bends towards a first side, the first film layer and the second film layer can contact each other and form electric connection as the first flexible layer and the second flexible layer bend; and when the flexible substrate bends towards a second side or does not bend, the first film layer and the second film layer can be separated from each other and disconnect the electric connection as the first flexible layer and the second flexible layer bend.

In a third aspect, the present invention further provides a manufacturing method of a flexible substrate, comprising:

forming a first flexible layer on a substrate;

forming a pattern comprising a first film layer on the first flexible layer;

forming an insulating layer on the first flexible layer;

forming a pattern comprising a second film layer on the insulating layer; and forming a second flexible layer on the insulating layer and the second film layer; wherein, when the flexible substrate bends towards a first side, the first film layer and the second film layer can contact each other and form electric connection as the first flexible layer and the second flexible layer bend; and when the flexible substrate bends towards a second side or does not bend, the first film layer and the second film layer can be separated from each other and disconnect the electric connection as the first flexible layer and the second flexible layer bend or do not bend.

In a fourth aspect, the present invention further provides a flexible display panel, comprising any flexible substrate as describe above.

Optionally, the flexible display panel is a double sided flexible display panel.

In a fifth aspect, the present invention further provides a flexible display device, comprising any flexible panel as described above.

Optionally, the flexible display device is a double sided flexible display device.

As can be known from the above-described technical solution, the present invention changes the technical concept in the prior art that electrically connected structures are generally combined with each other, and enables the electrically connected first film layer 11 and the second film layer 12 to be separated from each other in one bending state and contact each other in another bending state, thus dispersing the stretching force from both sides to avoid being damaged. Furthermore, the first flexible layer 13 and the second flexible layer 14 in the present invention can effectively protect the first film layer 11 and the second film layer 12 from other damages during bending. Therefore, the present invention can solve the problem that bending a flexible display panel may damage internal components thereof, and can improve the reliability and durability of the flexible display device.

Further, the present invention can realize the millimeter magnitude of separation between the first film layer 11 and the second film layer 12 (when the flexible display panel bends, the originally adjacent structures can be separated from each other as far as several millimeters), thus greatly improving the separation magnitude compared to the micrometer magnitude of structure separation in the prior art.

Moreover, the flexible substrate provided by the present invention can realize the function of controlling the display state by bending states, for example, curved surface display, bend hiding, display switching of the double sided display and the like, thus providing a novel choice for the control manner of a flexible display device.

Of course, any one product or method of the present invention does not necessarily achieve all the advantages as described above.

BRIEF DESCRIPTION OF THE DRAWINGS

In order to clearly illustrate technical solutions of embodiments of the present invention or those in the prior art, the drawings required for description of the embodiments or the prior art will be briefly introduced hereafter. Obviously, the drawings in the description hereafter only represent embodiments of present invention. An ordinary skilled person in the art can acquire other drawings according to these drawings without involving an inventive effort.

DETAILED DESCRIPTION OF SPECIFIC EMBODIMENTS

In order to make the objectives, technical solutions and advantages of the present invention clearer, the technical solutions in embodiments of the present invention will be clearly and completely described hereafter in conjunction with drawings in embodiments of the present invention. Obviously, the described embodiments are only some embodiments of the present invention, rather than all the embodiments of the present invention. Any the other embodiments obtained by an ordinary person skilled in the art on the basis of the embodiments of the present invention without involving an inventive effort are within the protection scope of the present invention.

Figure 1:
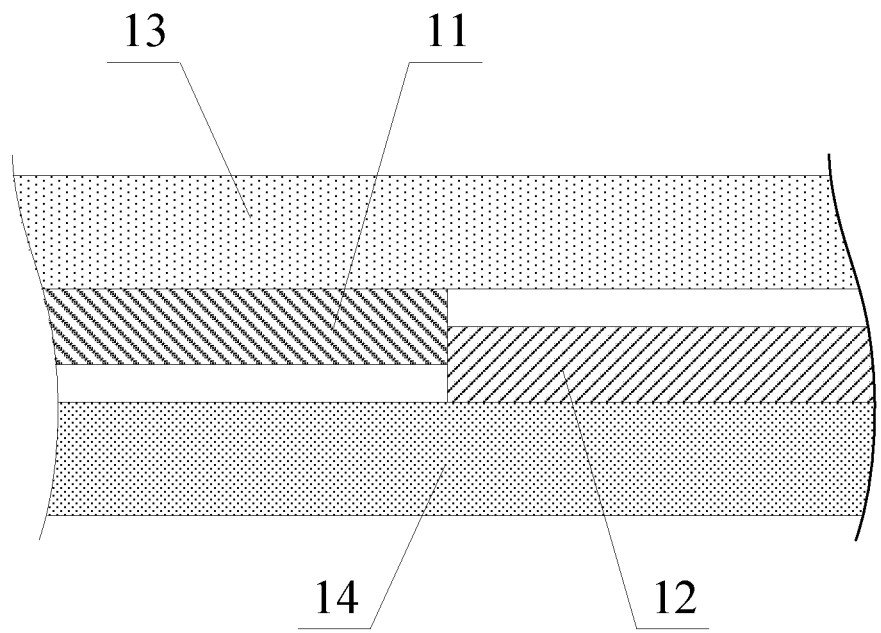
FIG. 1 is a partial section view of a flexible substrate in the thickness direction according to an embodiment of the present invention.

FIG. 1 is a partial section view of a flexible substrate in the thickness direction according to an embodiment of the present invention. With reference to FIG. 1, the flexible substrate comprises a first film layer 11 and a second film layer 12 which are electrically connected with each other, and further comprises a first flexible layer 13 and a second flexible layer 14, wherein the first film layer 11 and the second film layer 12 are both located between the first flexible layer 13 and the second flexible layer 14. Furthermore, the first film layer 11 is disposed on the first flexible layer 13, and the second film layer 12 is disposed on the second flexible layer 14. The first film layer or the second film layer can be disposed on the first flexible substrate or the second flexible substrate by means of laminating, sticking, etc., such that the film layer and the flexible substrate have a certain binding force therebetween, and are not prone to be separated from each other when being subject to an external force.

Furthermore, the first film layer 11 and the second film layer 12 at least have conductor or semiconductor properties, so as to be electrically connected in a powered-on operating state.

To facilitate description, the side adjacent to the first flexible layer 13 is designated as a first side, and the side adjacent to the second flexible layer 14 is designated as a second side.

Figure 2:
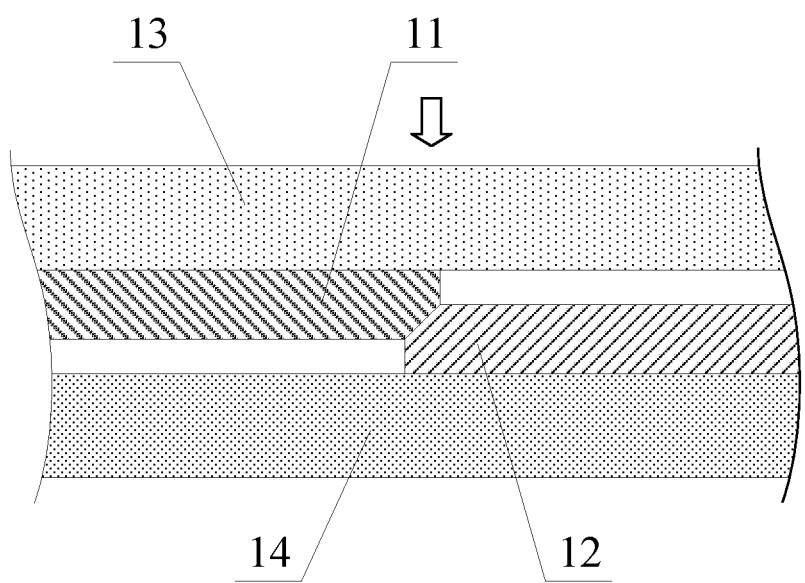
FIG. 2 is a partial section view of the flexible substrate as shown in FIG. 1 when it bends towards a first side.

FIG. 2 is a partial section view of the flexible substrate as shown in FIG. 1 when it bends towards the first side. With reference to FIG. 2, when the flexible substrate bends towards the first side, the first film layer 11 and the second film layer 12 can contact each other and form electric connection as the first flexible layer 13 and the second flexible layer 14 bend.

Figure 3:
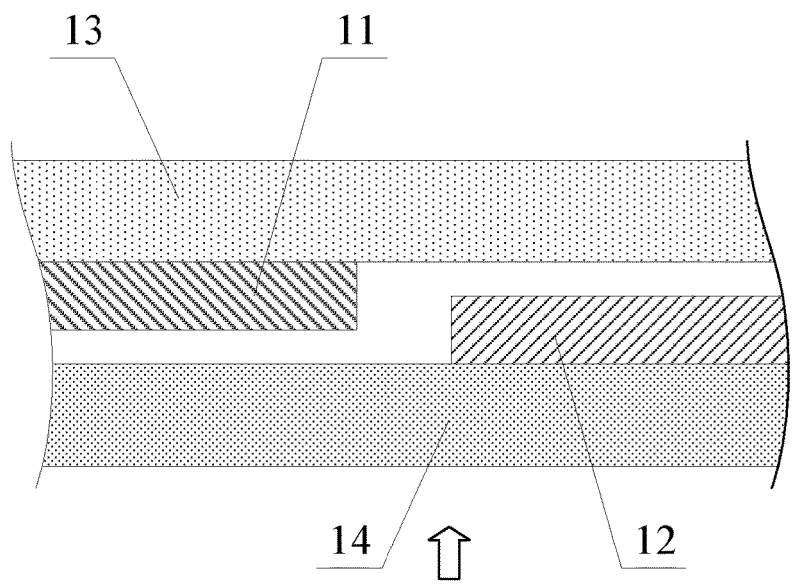
FIG. 3 is a partial section view of the flexible substrate as shown in FIG. 1 when it bends towards a second side or does not bend.

FIG. 3 is a partial section view of the flexible substrate as shown in FIG. 1 when it bends towards the second side or does not bend (i.e., remains flat). With reference to FIG. 3, when the flexible substrate bends towards the second side or does not bend, the first film layer 11 and the second film layer 12 can be separated from each other and disconnect the electric connection as the first flexible layer 13 and the second flexible layer 14 bend.

Figure 4A:
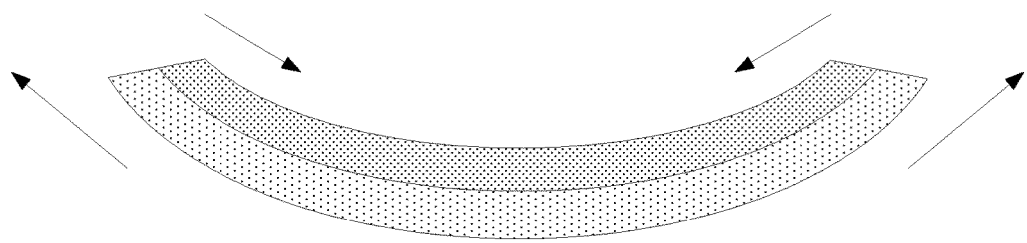
FIG. 4A and FIG. 4B are respectively sectional schematic diagrams of the flexible substrate as shown in FIG. 1 in bending states.
Figure 4B:
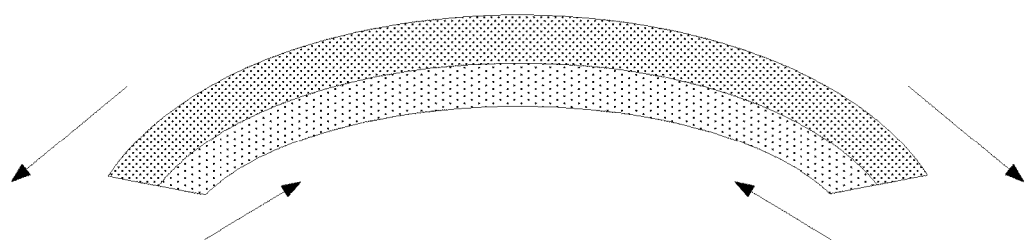

FIG. 4A and FIG. 4B are sectional schematic diagrams of the flexible substrate as shown in FIG. 1 in bending states respectively. With reference to FIG. 4A, when the flexible substrate bends towards the first side, since the flexible substrate has a certain thickness, the first side surface of the flexible substrate is pressed and the area thereof is reduced, and the second side surface of the flexible substrate is stretched and the area thereof is increased. Similarly, with reference to FIG. 4B, when the flexible substrate bends towards the second side, since the flexible substrate has a certain thickness, the second side surface of the flexible substrate is pressed and the area thereof is reduced, and the first side surface of the flexible substrate is stretched and the area thereof is increased. Therefore, the first flexible layer 13 and the second flexible layer 14 can be disposed at proper positions in the thickness direction of the flexible substrate, such that the first flexible layer 13 and the second flexible layer 14 can be stretched or pressed when the flexible substrate bends towards different directions; the first flexible layer 13 and the second flexible layer 14 may have different elastic moduli (i.e., different rigidities), such that a relative displacement may be produced between the first film layer 11 located on the first flexible layer 13 and the second film layer 12 located on the second flexible layer 14; as a result, when the flexible substrate bends towards the first side, the first film layer 11 and the second film layer 12 can contact each other; and when the flexible substrate bends towards the second side or does not bend, the first film layer 11 and the second film layer 12 can be separated from each other. For example, the first flexible layer 13 and the second flexible layer 14 may be respectively disposed at a first preset position and a second preset position in the thickness direction of the flexible substrate, and the second flexible layer 14 may be more rigid than the first flexible layer 13, such that:

when the flexible substrate bends towards the first side, the first film layer 11 and the second film layer 12 can contact each other and form electric connection as the first flexible layer 13 and the second flexible layer 14 bend; and when the flexible substrate bends towards the second side or does not bend, the first film layer 11 and the second film layer 12 can be separated from each other and disconnect the electric connection as the first flexible layer 13 and the second flexible layer 14 bend.

It should be understood that the stretching or pressing state of the first flexible layer 13 or the second flexible layer 14 depends on the bending state of the flexible substrate; therefore, in order to realize the contact and separation between the first film layer 11 and the second film layer 12, "the flexible substrate bends towards the first side" and "the flexible substrate bends towards the second side" as described above are both within a certain bending extent.

However, with respect to the first film layer 11 and the second film layer 12, in the prior art, two electrically connected film layers generally contact each other directly, thus the first film layer 11 and the second film layer 12 are generally configured as a directly connected conductor structure, and have a certain binding force therebetween. On the basis of the prior art, when the flexible substrate bends, the first film layer 11 and second film layer 12 contacting each other become a integral body subject to the stretching forces from both sides, and are prone to be damaged.

On the basis of the above-described configurations, the present invention can enable the electrically connected first film layer 11 and the second film layer 12 to be separated from each other in one bending state and contact each other in another bending state, and can disperse the stretching forces from both sides to avoid being damaged. Furthermore, the first flexible layer 13 and the second flexible layer 14 in the present invention can effectively protect the first film layer 11 and the second film layer 12 from other damages during bending. Therefore, embodiments of the present invention can solve the problem that a bent flexible display panel may damage internal components thereof, and can improve the reliability and durability of the flexible display device.

Further, embodiments of the present invention can realize separation between the first film layer 11 and the second film layer 12 in a millimeter magnitude (when the flexible display panel bends, the originally adjacent structures can be separated from each other by as far as several millimeters), thus greatly improving the separation magnitude compared to the micrometer magnitude of structure separation in the prior art.

Moreover, the flexible substrate provided by embodiments of the present invention can realize the function of controlling the display state by bending states, for example, curved surface display, bend hiding, display switching of a double sided display and the like, thus providing a novel choice for the control manner of the flexible display device.

It should be noted that in the non-bending state, the first film layer 11 and the second film layer 12 may be connected (as shown in FIG. 1), or may be disconnected, which determines the operating state of the flexible substrate in the non-bending state, and can be configured by a person skilled in the art according to actual needs. This is not restricted in the present invention.

It should be further noted that besides the first film layer 11 and the second film layer 12, the flexible substrate may further comprise other structures between the first flexible layer 13 and the second flexible layer 14; in an area not shown in FIGS. 1-3, the first flexible layer 13 and the second flexible layer 14 may also have other shapes or thicknesses; the first flexible layer 13 and/or the second flexible layer 14 may be disposed on the whole flexible substrate or in a given area thereof, which is not restricted by the present invention.

In addition, it should be further noted that preferably, the binding force between the first film layer 11 and the first flexible layer 13 is greater than the binding force between the first film layer 11 and the second flexible layer 14; and the binding force between the second film layer 12 and the second flexible layer 14 is greater than the binding force between the second film layer 12 and the first flexible layer 13. On this basis, parameters such as the forming materials and forming processes of the first film layer 11, the second film layer 12, the first flexible layer 13 and the second flexible layer 14 may be set properly, such that after the flexible substrate has bent multiple times, the first film layer 11 is not separated from the first flexible layer 13, nor stuck on the second flexible layer 14; and the second film layer 12 is not separated from the second flexible layer 14, nor stuck on the first flexible layer 13.

On the basis of any technical solution as described above, the surface of the first film layer 11 opposite to the second film layer 12 may be a first preset surface having a preset shape; and the surface of the second film layer 12 opposite to the first film layer 11 may be a second preset surface having a preset shape. Moreover, the shape of the first preset surface and the shape of the second preset surface may correspond to each other, e.g. the two shapes are complementary to each other; and when the first film layer and the second film layer contact each other, the first preset surface and second preset surface may be fitted with each other, such that the first film layer and the second film layer may have a small contact resistance therebetween.

Figure 5:
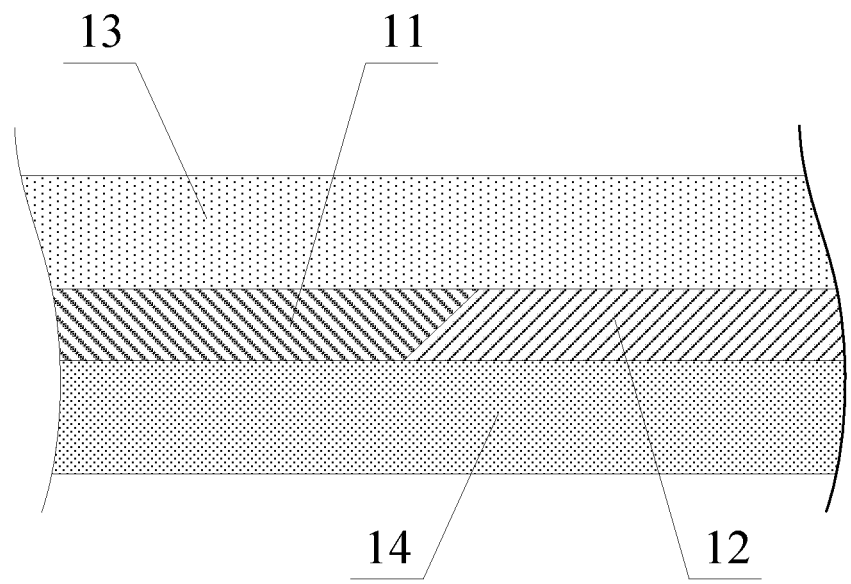
FIG. 5 is a partial section view of a flexible substrate in the thickness direction according to another embodiment of the present invention.
Figure 6:
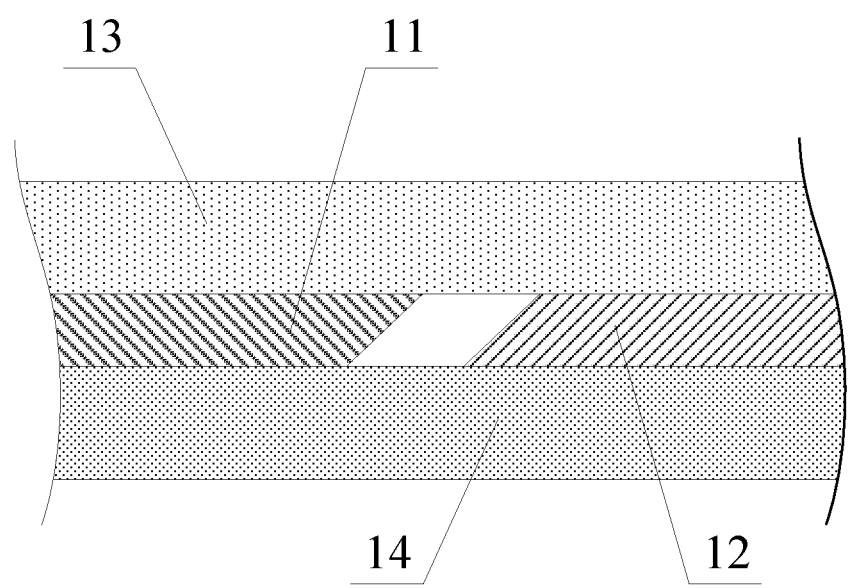
FIG. 6 is a partial section view of the flexible substrate as shown in FIG. 5 when it bends towards a second side or does not bend.
Figure 7:
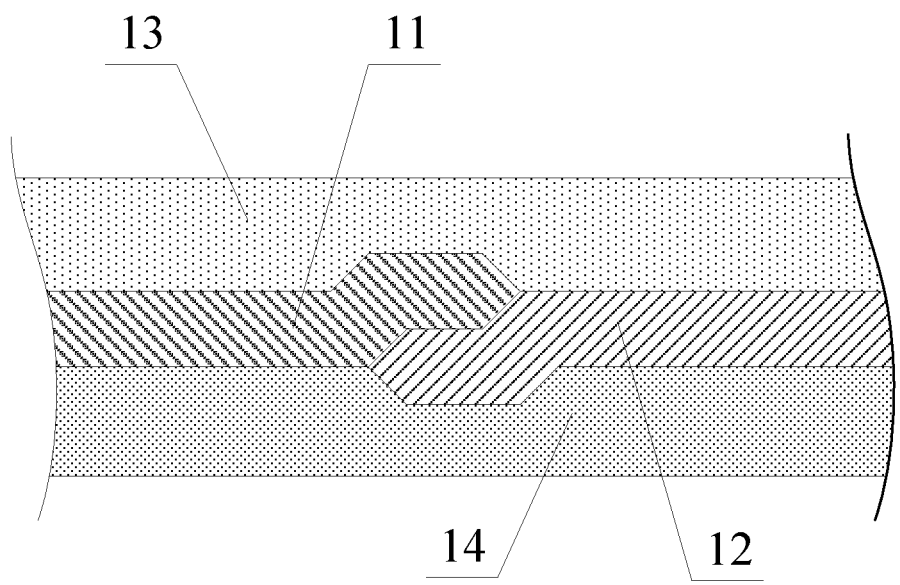
FIG. 7 is a partial section view of the flexible substrate as shown in FIG. 5 when it bends towards a first side.

For example, the first preset surface and the second preset surface may be uneven curved surfaces corresponding to each other, or flat surfaces having certain inclination angles (which may be set by a person skilled in the art according to specific application scenarios), or surfaces of any other shapes. Furthermore, in order to further reduce the contact resistance and reduce the distance between the first flexible layer 13 and the second flexible layer 14, or to reduce the resistance between the first film layer 11 and the second film layer 12, the first film layer may contact the second flexible substrate 14, and the second film layer 12 may contact the first flexible substrate 13 (the requirement for the binding forces as describe above should also be satisfied). Specifically, FIG. 5 is a partial section view of a flexible substrate in the thickness direction according to another embodiment of the present invention. As shown in FIG. 5, the first preset surface of the first film layer 11 and the second preset surface of the second film layer 12 are both inclined surfaces having preset inclination angles. On this basis, the first film layer 11 and the second film layer 12 can be separated from and contact each other more effectively. As shown in FIG. 5, when the first film layer 11 perfectly contacts the second film layer 12, the large contact area enables the first film layer 11 and the second film layer 12 to have a small contact resistance therebetween; as shown in FIG. 6, when the first film layer 11 and the second film layer 12 are separated from each other, the inclined surfaces are easier to have relative displacement than surfaces of other shapes as the flexible substrate bends; as shown in FIG. 7, when the first film layer 11 and the second film layer 12 contact each other under excessive pressing, the inclined surfaces can enable the first film layer 11 and the second film layer 12 to be staggered up and down, which can still be separated from each other thereafter, such that the first film layer 11 and the second film layer 12 are not easy to generate shape-unrecoverable plastic deformation under excessive pressing.

As an example, the flexible substrate may further comprise a transistor, and a pixel electrode which is electrically connected to the source electrode or drain electrode of the transistor in an operating state, such that the first film layer 11 is the source electrode or drain electrode of the transistor, and the second film layer 12 is the pixel electrode. Specifically, the flexible substrate may be an array substrate in a display panel; and the first film layer 11 and the second film layer 12 may be the pixel electrode of a pixel circuit in the array substrate and the source electrode or drain electrode of the transistor respectively. On this basis, the connection of the pixel electrode and the transistor may be controlled by bending, such that the display state of the display panel may be changed by external bending.

As another example, the flexible substrate may further comprise a transistor; the transistor comprises a source electrode, a drain electrode and an active layer; in an operating state, the source electrode and the drain electrode are electrically connected to the active layer respectively, such that the first film layer 11 is the source electrode or drain electrode of the transistor; and the second film layer 12 is the active layer. Specifically, the first film layer 11 and the second film layer 12 may be the active layer and source electrode of the same transistor respectively, or may be the active layer and drain electrode of the same transistor respectively. On this basis, the connection between the source/drain electrode and the active layer in the transistor can be controlled by bending.

Of course, the first film layer 11 and the second film layer 12 may also be structures in the flexible substrate electrically connected in an operating state, which is not restricted by the present invention. Correspondingly, the first flexible layer 13 may be provided therein with at least one first via, and the second flexible layer 14 may be provided therein with at least one second via, such that the first film layer and the second film layer can form electric connection with a structure located above the flexible layer 13 or a structure located under the second flexible layer 14 in the flexible substrate via the first via and the second via, so as to realize necessary functions of the flexible substrate.

Figure 8:
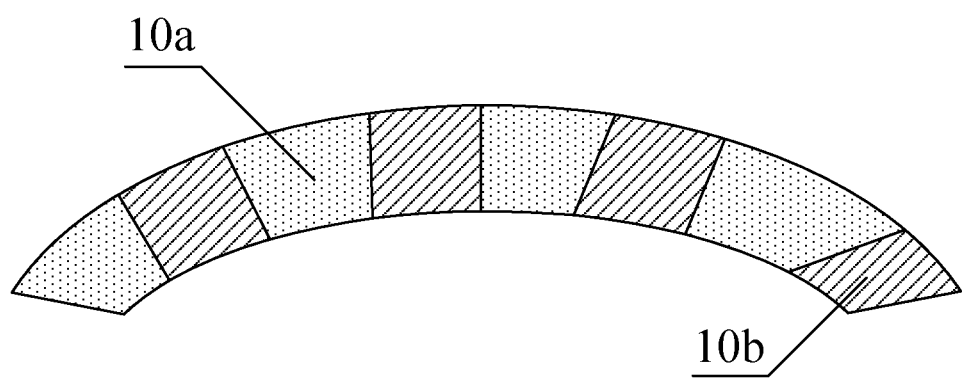
FIG. 8 is a section structure schematic diagram of a base substrate of a flexible substrate in the thickness direction.

On the other hand, the flexible substrate, as a bendable structure, may have a base substrate formed by a flexible material. Specifically, FIG. 8 is a section structure schematic diagram of the base substrate of a flexible substrate in the thickness direction. With reference to FIG. 8, the base substrate may comprise a plurality of first areas 15a and a plurality of second areas 15b; the plurality of first areas 15a and the plurality of second areas 15b are arranged alternately. Furthermore, the base substrate is formed by a flexible material in the first areas 15a, and is formed by a rigid material in the second areas 15b. On this basis, the rigid material in the base substrate enables the flexible substrate to have a certain crack resistance, while the flexible material in the base substrate enables the flexible substrate to have certain plasticity. Of course, the more densely the plurality of first areas 15a and the plurality of second areas 15b are arranged alternately, the more consistent the property of the base substrate at various positions will become.

Figure 9:
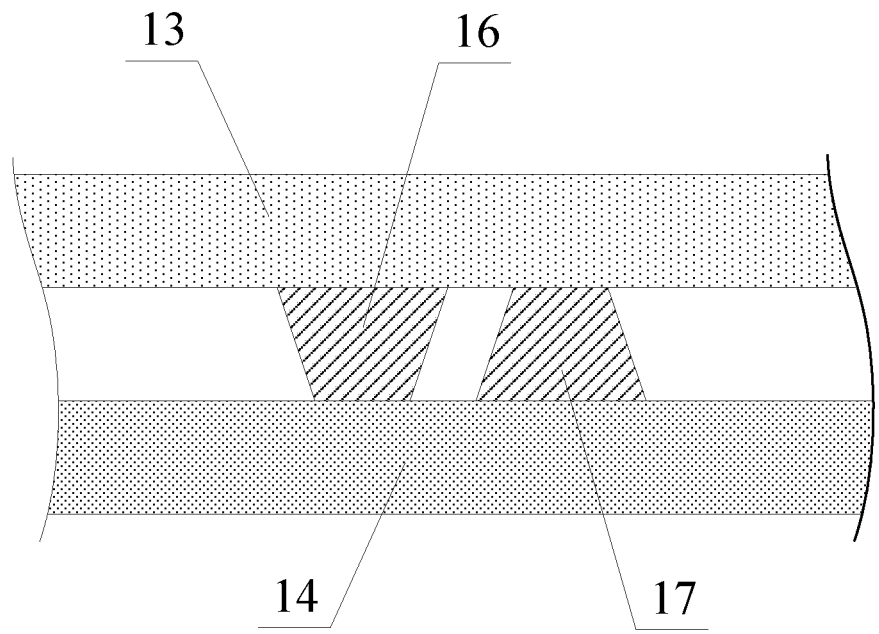
FIG. 9 is a partial section view of a flexible substrate in the thickness direction according to another embodiment of the present invention.

FIG. 9 is a partial section view of a flexible substrate in the thickness direction according to another embodiment of the present invention. With reference to FIG. 9, on the basis of any one flexible substrate structure as described above, the flexible substrate may further comprise a first spacer layer 16 and/or a second spacer layer 17 between the first flexible layer 13 and the second flexible layer 14, wherein the first spacer layer 16 and the first flexible layer 13 are bonded to each other, and the surface of the first spacer layer 16 capable of contacting the second flexible layer is a smooth surface; the second spacer layer 17 and the second flexible layer 14 are bonded to each other, and the surface of the second spacer layer 17 capable of contacting the first flexible layer 13 is a smooth surface. On this basis, the first spacer layer 16 and the second spacer layer 17 may be made of a material with a relatively high strength for stabilizing and supporting the first flexible layer 13 and the second flexible layer 14; furthermore, the smooth contact surfaces facilitate the relative displacement of the first flexible layer 13 and the second flexible layer 14, and are not easy to damage the first flexible layer 13 and the second flexible layer 14; moreover, when the flexible substrate comprises both a first spacer layer 16 and a second spacer layer 17, the first flexible layer 13 and the second flexible layer 14 are not prone to have excessive relative displacement due to the contact of the first spacer layer 16 and the second spacer layer 17 (which may be realized by properly presetting the positions of the first spacer layer 16 and the second spacer layer 17); that is, the first spacer layer 16 and the second spacer layer 17 can protect the first flexible layer 13 and the second flexible layer 14 from being excessively stretched.

Figure 10:
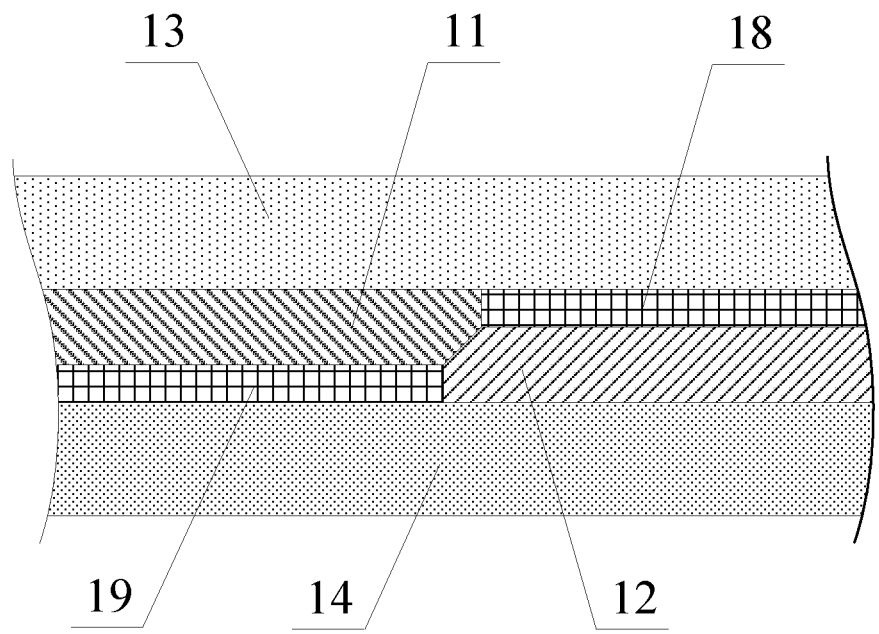
FIG. 10 is a partial section view of a flexible substrate in the thickness direction according to another embodiment of the present invention.

FIG. 10 is a partial section view of a flexible substrate in the thickness direction according to another embodiment of the present invention. With reference to FIG. 10, on the basis of any flexible substrate structure as described above, the flexible substrate may further comprise a first buffer layer 18 and/or a second buffer layer 19 between the first flexible layer 13 and the second flexible layer 14, wherein the first buffer layer 18 is disposed on the first flexible layer 13 in at least some areas corresponding to the second film layer 12, and is bonded with the first flexible layer 13, and the surface of the first buffer layer 18 capable of contacting the second film layer 12 is a smooth surface; and the second buffer layer 19 is disposed on the second flexible layer 14 in at least some areas corresponding to the first film layer 11, and is bonded with the second flexible layer 14, and the surface of the second buffer layer 19 capable of contacting the first film layer 11 is a smooth surface. On this basis, the first film layer 11 may not directly contact the second flexible layer 14, and the second film layer 12 may not directly contact the first flexible layer 13. The first buffer layer 18 and the second buffer layer 19 can reduce the friction between the first film layer 11 and the second flexible layer 14 and the friction between the second film layer 12 and the first flexible layer 13, and perform the functions of support, protection etc.

Figure 11:
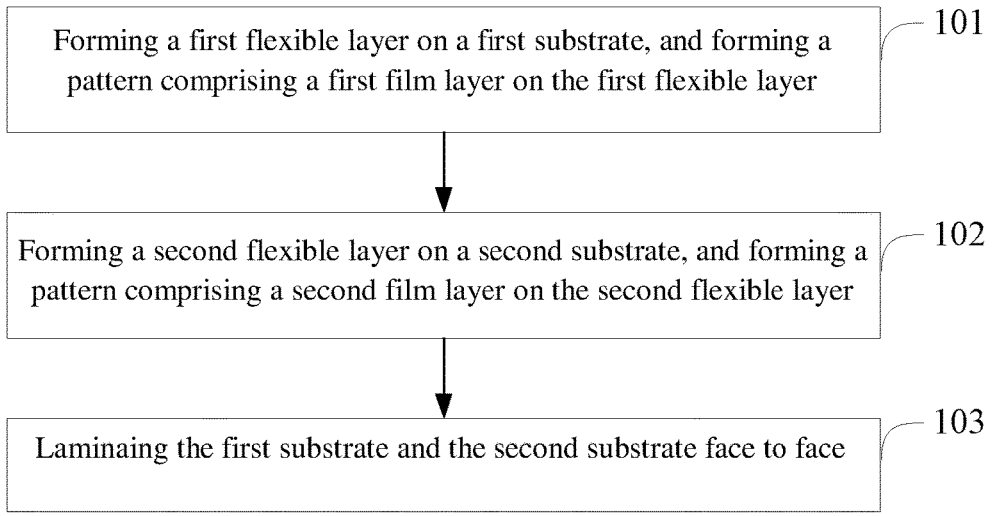
FIG. 11 is a stepwise flow schematic diagram of a manufacturing method of a flexible substrate according to an embodiment of the present invention.

FIG. 11 is a stepwise flow schematic diagram of a manufacturing method of a flexible substrate according to an embodiment of the present invention. With reference to FIG. 11, the method comprises:

Step 101, forming a first flexible layer on a first substrate, and forming a pattern comprising a first film layer on the first flexible layer;

Step 102, forming a second flexible layer on a second substrate, and forming a pattern comprising a second film layer on the second flexible layer;

Step 103, laminating the first substrate and the second substrate face to face, such that:

the first film layer and the second film layer are located between the first flexible layer and the second flexible layer;

when the flexible substrate bends towards a first side, the first film layer and the second film layer can contact each other and form electric connection as the first flexible layer and the second flexible layer bend; and when the flexible substrate bends towards a second side or does not bend, the first film layer and the second film layer can be separated from each other and disconnect the electric connection as the first flexible layer and the second flexible layer bend.

As can be seen, the method can be used to manufacture any flexible substrate as described above, can solve the same technical problem and achieve similar technical effects. In addition, the method may adopt the manner of manufacturing separately and then assembling together, guaranteeing the binding force between the first film layer and the first flexible layer and the binding force between the second film layer and the second flexible layer, thus improving the performances of the flexible substrate, and reducing the cost.

Figure 12:
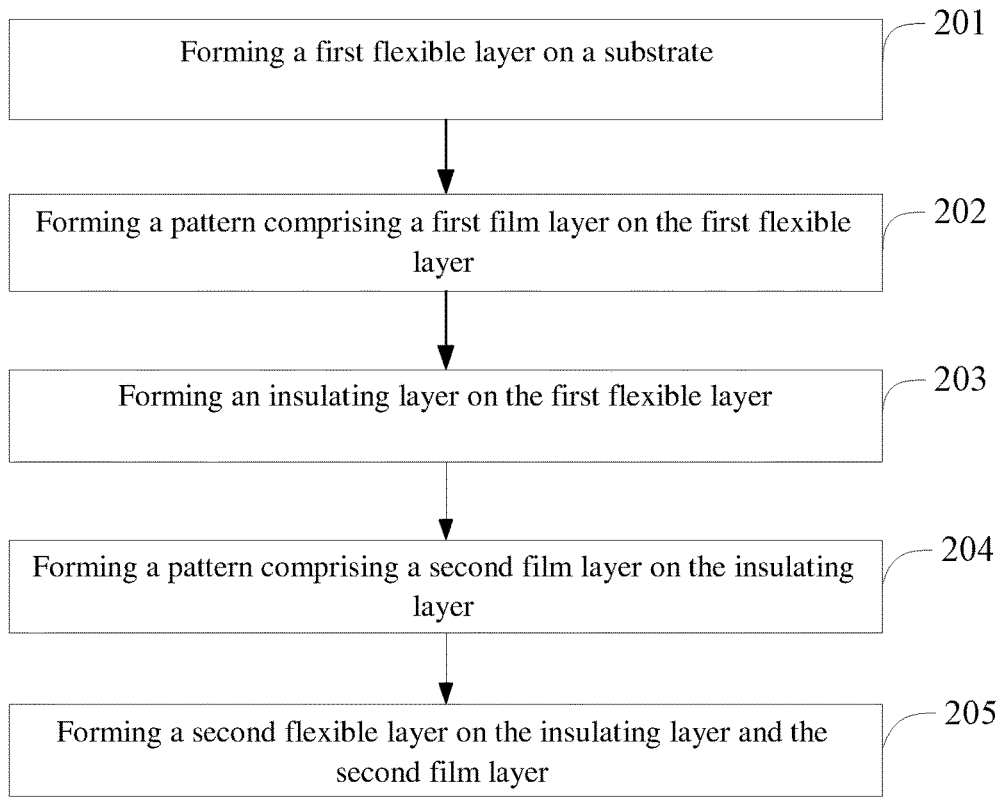
FIG. 12 is a stepwise flow schematic diagram of a manufacturing method of a flexible substrate according to another embodiment of the present invention.

FIG. 12 is a stepwise flow schematic diagram of a manufacturing method of a flexible substrate according to another embodiment of the present invention. With reference to FIG. 12, the method comprises:

Step 201, forming a first flexible layer on a substrate;

Step 202, forming a pattern comprising a first film layer on the first flexible layer;

Step 203, forming an insulating layer on the first flexible layer;

Step 204, forming a pattern comprising a second film layer on the insulating layer; and Step 205, forming a second flexible layer on the insulating layer and the second film layer; wherein, when the flexible substrate bends towards a first side, the first film layer and the second film layer can contact each other and form electric connection as the first flexible layer and the second flexible layer bend; and when the flexible substrate bends towards a second side or does not bend, the first film layer and the second film layer can be separated from each other and disconnect the electric connection as the first flexible layer and the second flexible layer bend.

As can be seen, the method can be used to manufacture the flexible substrate as shown in FIG. 10, can solve the same technical problem and achieve similar technical effects. In addition, the method adopts the manner of sequentially forming the structure of each layer, thus reducing the manufacturing cost of the flexible substrate.

On the basis of the same inventive concept, an embodiment of the present invention provides a flexible display panel, the flexible display panel comprising any flexible substrate as described above. For example, the flexible display panel may be any type of liquid crystal display panel, or an organic LED display panel; and the flexible substrate may be an array substrate, a color film substrate or any one substrate comprising a circuit structure of the flexible display panel, which is not restricted by the present invention. Particularly, the flexible display panel may be a double sided flexible display panel. For example, the flexible display panel may comprise a first flexible substrate (any flexible substrate as described above) and a second flexible substrate (any flexible substrate as described above), which are disposed back to back and are used to realize the display function on the two side surfaces of the flexible display panel respectively. Under proper settings, when the flexible display panel bends towards one side, the two flexible substrates disposed back to back are in opposite operating states; and when the flexible display panel does not bend, the two flexible substrates may be in any operating states as preset. On this basis, the flexible display panel can realize the functions of curved surface display, bend hiding, bend display, display switching of the double sided display and the like, thus providing a novel choice for the display manner and control manner of the flexible display device.

On the basis of the same inventive concept, an embodiment of the present invention provides a flexible display device, comprising any flexible display panel as described above. It should be noted that the flexible display device in the present embodiment may be any products or components having a display function, such as an electronic paper, a mobile phone, a tablet computer, a television, a notebook computer, a digital picture frame, a navigator and the like. Particularly, the flexible display device may be a double sided flexible display device. Specifically, the double sided display function thereof may be realized by a display panel having the double sided display function, or by two single side display panels disposed back to back, which is not restricted by the present invention. As can be seen, since the flexible display device comprises any flexible display panel as described above, the flexible display device can solve the same technical problem and achieve similar technical effects.

It should be noted that in the description of the present invention, the direction or position relationships indicated by the terminologies "on", "under" and the like are the direction or position relationships as shown in the figures, are only intended to describe the present invention briefly, and not to indicate or imply that the specified devices or elements must be at a specific position or be constructed and operated in a specific manner, and thus should not be understood as limitation of the present invention. Unless stated or defined otherwise explicitly, the terminologies "install", "connect" and "connection" should be interpreted broadly, for example, the connection may be fixed connection, detachable connection or integral connection, mechanical connection or electrical connection, direct connection or indirect connection via an intermediate medium, or internal communication of two elements. An ordinary person skilled in the art could understand the specific meanings of the terminologies in the present invention according to specific circumstances.

It should be further noted that in this text, the relation terminologies such as first, second and the like are only intended to distinguish one entity or operation from another entity or operation, and not necessarily to require or imply that the entities or operations have such actual relations or sequence therebetween; furthermore, the terminologies "comprise", "include" or any other variations thereof are intended to be nonexclusive inclusion, such that a process, method, object or device comprising a series of elements may not only comprise the elements explicitly listed, but also comprise other elements which are not explicitly listed, or may further comprise elements inherent to the process, method, object or device. Without further limitation, the statement "comprise a . . . " does not eliminate the possibility that the process, method, object or device comprising the element explicitly listed may further comprise other elements which are not explicitly listed.

The embodiments above are only intended to illustrate but not to restrict the technical solution of the present invention; although the present invention is described in detail with reference to the embodiments above, it should be understood that an ordinary person skilled in the art may still make modifications to the technical solutions of the embodiments above, or make equivalent substitutions for part of the technical features thereof; and the modifications or substitutions do not make the essence of the corresponding technical solutions deviate from the spirit and protection scope of the technical solutions of the embodiments of the present invention.

The invention claimed is:
1. A flexible substrate comprising:
a first film layer;
a second film layer, the first film layer and the second film layer including conductors or semiconductors;
a first flexible layer; and
a second flexible layer; the first film layer and the second film layer located between the first flexible layer and the second flexible layer, wherein:
the first film layer and the first flexible layer are bonded with each other, and the second film layer and the second flexible layer are bonded with each other;
when the flexible substrate bends towards a first side, the first film layer and the second film layer contact each other and form an electric connection between the conductors or semiconductors of the first film layer and the conductors or semiconductors of the second film layer as the first flexible layer and the second flexible layer bend; and
when the flexible substrate bends towards a second side or does not bend, the first film layer and the second film layer are separated from each other to prevent the electric connection as the first flexible layer and the second flexible layer bend or do not bend.

2. The flexible substrate according to claim 1, wherein a surface of the first film layer adjacent to the second film layer is a first preset surface having a preset shape, and a surface of the second film layer adjacent to the first film layer is a second preset surface having a shape complementary to the first preset surface.

3. The flexible substrate according to claim 2, wherein the first preset surface and the second preset surface are both inclined surfaces having preset inclination angles.

4. The flexible substrate according to claim 1, wherein a binding force between the first film layer and the first flexible layer is greater than a binding force between the first film layer and the second flexible layer, and a binding force between the second film layer and the second flexible layer is greater than a binding force between the second film layer and the first flexible layer.

5. The flexible substrate according to claim 1, wherein:
the first film layer is a source electrode or a drain electrode of a transistor of the flexible substrate;
the second film layer is a pixel electrode; and
the pixel electrode is electrically connected to the source electrode or drain electrode of the transistor in an operating state.

6. The flexible substrate according to claim 1, wherein:
the first film layer is a source electrode or a drain electrode of a transistor of the flexible substrate;
the second film layer is an active layer of the transistor; and
in an operating state, the source electrode and the drain electrode are electrically connected to the active layer.

7. The flexible substrate according to claim 5, wherein the first flexible layer includes at least one first via, and the second flexible layer includes at least one second via.

8. The flexible substrate according to claim 1, wherein:
the flexible substrate comprises a base substrate;
the base substrate comprises a plurality of first areas including a flexible material and a plurality of second areas including a rigid material; and
the plurality of first areas and the plurality of second areas are arranged alternately.

9. The flexible substrate according to claim 1, wherein:
the flexible substrate further comprises a first spacer layer and/or a second spacer layer between the first flexible layer and the second flexible layer;
the first spacer layer is disposed on the first flexible layer, and a surface thereof facing the second flexible substrate is a smooth surface; and the second spacer layer is disposed on the second flexible layer, and a surface thereof facing the first flexible substrate is a smooth surface.

10. The flexible substrate according to claim 1, wherein:
the flexible substrate further comprises a first buffer layer and/or a second buffer layer between the first flexible layer and the second flexible layer;
the first buffer layer is disposed on the first flexible layer in at least some areas corresponding to the second film layer, and a surface thereof facing the second film layer is a smooth surface; and
the second buffer layer is disposed on the second flexible layer in at least some areas corresponding to the first film layer, and a surface thereof facing the first film layer is a smooth surface.

11. A method of manufacturing a flexible substrate, the method comprising:
forming a first flexible layer on a first substrate, and forming a pattern comprising a first film layer on the first flexible layer;
forming a second flexible layer on a second substrate, and forming a pattern comprising a second film layer on the second flexible layer, the first film layer and the second film layer including conductors or semiconductors;
laminating the first substrate and the second substrate face to face, wherein:
the first film layer and the second film layer are located between the first flexible layer and the second flexible layer;
when the flexible substrate bends towards a first side, the first film layer and the second film layer contact each other and form an electric connection between the conductors or semiconductors of the first film layer and the conductors or semiconductors of the second film layer as the first flexible layer and the second flexible layer bend; and
when the flexible substrate bends towards a second side or does not bend, the first film layer and the second film layer are separated from each other to prevent the electric connection as the first flexible layer and the second flexible layer bend or do not bend.

12. A method of manufacturing of a flexible substrate, the method comprising:
forming a first flexible layer on a substrate;
forming a pattern comprising a first film layer on the first flexible layer;
forming an insulating layer on the first flexible layer;
forming a pattern comprising a second film layer on the insulating layer, the first film layer and the second film layer including conductors or semiconductors; and
forming a second flexible layer on the insulating layer and the second film layer; wherein:
when the flexible substrate bends towards a first side, the first film layer and the second film layer contact each other and form an electric connection between the conductors or semiconductors of the first film layer and the conductors or semiconductors of the second film layer as the first flexible layer and the second flexible layer bend; and
when the flexible substrate bends towards a second side or does not bend, the first film layer and the second film layer are separated from each other to prevent the electric connection as the first flexible layer and the second flexible layer bend or do not bend.

13. A flexible display panel, comprising the flexible substrate as described in claim 1.

14. The flexible display panel according to claim 13, wherein the flexible display panel is a double sided flexible display panel.

15. A flexible display device, comprising the flexible display panel as described in claim 13.

16. The flexible display device according to claim 15, wherein the flexible display device is a double-sided flexible display device.

17. The flexible substrate according to claim 6, wherein the first flexible layer includes at least one first via, and the second flexible layer includes at least one second via.

18. The flexible substrate according to claim 2, wherein:
the flexible substrate further comprises a first spacer layer and/or a second spacer layer between the first flexible layer and the second flexible layer;
the first spacer layer is disposed on the first flexible layer, and a surface thereof facing the second flexible substrate is a smooth surface; and
the second spacer layer is disposed on the second flexible layer, and a surface thereof facing the first flexible substrate is a smooth surface.

19. The flexible substrate according to claim 2, wherein:
the flexible substrate further comprises a first buffer layer and/or a second buffer layer between the first flexible layer and the second flexible layer;
the first buffer layer is disposed on the first flexible layer in at least some areas corresponding to the second film layer, and a surface thereof facing the second film layer is a smooth surface; and
the second buffer layer is disposed on the second flexible layer in at least some areas corresponding to the first film layer, and a surface thereof facing the first film layer is a smooth surface.

20. A flexible display panel, comprising the flexible substrate as described in claim 2.

* * * * *